United States Patent
Kerber et al.

(10) Patent No.: US 10,957,780 B2
(45) Date of Patent: Mar. 23, 2021

(54) NON-UNIFORM GATE DIELECTRIC FOR U-SHAPE MOSFET

(71) Applicant: INTERNATIONAL BUSINESS MACHINES CORPORATION, Armonk, NY (US)

(72) Inventors: Pranita Kerber, Mount Kisco, NY (US); Effendi Leobandung, Stormville, NY (US); Philip J. Oldiges, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/289,019

(22) Filed: Feb. 28, 2019

(65) Prior Publication Data

US 2019/0198640 A1    Jun. 27, 2019

Related U.S. Application Data

(62) Division of application No. 15/597,870, filed on May 17, 2017, now Pat. No. 10,256,319, which is a division of application No. 14/626,323, filed on Feb. 19, 2015, now abandoned.

(51) Int. Cl.
*H01L 29/66* (2006.01)
*H01L 29/08* (2006.01)
*H01L 21/385* (2006.01)

(52) U.S. Cl.
CPC .... *H01L 29/66545* (2013.01); *H01L 29/0847* (2013.01); *H01L 29/6656* (2013.01); *H01L 29/66553* (2013.01); *H01L 29/66621* (2013.01); *H01L 29/66628* (2013.01); *H01L 21/385* (2013.01)

(58) Field of Classification Search
CPC ......... H01L 29/66545; H01L 29/66553; H01L 29/6656; H01L 29/0847; H01L 29/66628; H01L 29/66621; H01L 29/41791; H01L 2029/7858
See application file for complete search history.

(56) References Cited

U.S. PATENT DOCUMENTS

| 5,314,834 A | 5/1994 | Mazure et al. |
| 5,610,422 A | 3/1997 | Yanagiya et al. |
| 5,627,097 A * | 5/1997 | Venkatesan ..... H01L 21/823814 257/E21.433 |

(Continued)

OTHER PUBLICATIONS

List of IBM Patents or Patent Applications Treated as Related Dated Feb. 28, 2019, 2 Pages.

*Primary Examiner* — Jarrett J Stark
(74) *Attorney, Agent, or Firm* — Scully, Scott, Murphy & Presser, P.C.; L. Jeffrey Kelly, Esq.

(57) ABSTRACT

A U-shaped gate dielectric structure is provided that has a horizontal gate dielectric portion having a vertical thickness, and a vertical gate dielectric wall portion extending upwards from the horizontal gate dielectric portion. The vertical gate dielectric wall portion has a lateral thickness that is greater than the vertical thickness of the horizontal gate dielectric portion. The U-shaped gate dielectric structure houses a gate conductor portion. Collectively, the U-shaped gate dielectric structure and the gate conductor portion provide a functional gate structure that has reduced capacitance.

16 Claims, 7 Drawing Sheets

(56) References Cited

U.S. PATENT DOCUMENTS

| | | | | |
|---|---|---|---|---|
| 5,953,605 A * | 9/1999 | Kodama | ............. | H01L 21/2257 438/231 |
| 6,291,861 B1 * | 9/2001 | Iwata | ................. | H01L 21/2257 257/385 |
| 6,323,525 B1 * | 11/2001 | Noguchi | ............. | H01L 21/2257 257/344 |
| 6,744,101 B2 | 6/2004 | Long et al. | | |
| 6,887,761 B1 * | 5/2005 | Akatsu | ............. | H01L 29/66666 438/270 |
| 7,804,130 B1 | 9/2010 | Fung | | |
| 8,030,708 B2 * | 10/2011 | Tateshita | ........... | H01L 21/28114 257/213 |
| 8,343,829 B2 | 1/2013 | Wang et al. | | |
| 8,546,203 B1 * | 10/2013 | Cheng | ............. | H01L 29/66628 257/347 |
| 8,658,500 B2 | 2/2014 | Purtell et al. | | |
| 8,709,890 B2 | 4/2014 | Cheng et al. | | |
| 8,779,511 B2 | 7/2014 | Kanike et al. | | |
| 9,034,701 B2 * | 5/2015 | Cheng | ............. | H01L 29/78603 438/183 |
| 9,041,061 B2 * | 5/2015 | Majumdar | .............. | H01L 29/78 257/192 |
| 9,373,704 B2 | 6/2016 | Lee et al. | | |
| 9,564,500 B2 | 2/2017 | Ando et al. | | |
| 9,882,002 B2 | 1/2018 | Tseng et al. | | |
| 2002/0190284 A1 * | 12/2002 | Murthy | ............. | H01L 21/28052 257/286 |
| 2002/0197810 A1 | 12/2002 | Hanafi et al. | | |
| 2005/0032322 A1 * | 2/2005 | Kim | ................. | H01L 21/26586 438/301 |
| 2005/0048752 A1 * | 3/2005 | Doris | ...................... | H01L 21/84 438/595 |
| 2005/0090066 A1 * | 4/2005 | Zhu | ......................... | H01L 21/84 438/300 |
| 2006/0046354 A1 * | 3/2006 | Kreipl | ................... | H01L 27/112 438/132 |
| 2006/0084235 A1 * | 4/2006 | Barr | ................. | H01L 29/66636 438/300 |
| 2006/0220152 A1 | 10/2006 | Huang et al. | | |
| 2006/0286755 A1 | 12/2006 | Brask et al. | | |
| 2008/0277735 A1 * | 11/2008 | Ko | ................. | H01L 21/823807 257/369 |
| 2009/0068810 A1 * | 3/2009 | Tsai | ..................... | H01L 29/7834 438/300 |
| 2010/0038705 A1 * | 2/2010 | Doris | ................ | H01L 21/28026 257/327 |
| 2011/0042744 A1 * | 2/2011 | Cheng | ............... | H01L 29/66795 257/347 |
| 2011/0079820 A1 * | 4/2011 | Lai | ...................... | H01L 21/3247 257/190 |
| 2012/0061759 A1 * | 3/2012 | Cheng | ............... | H01L 29/66628 257/347 |
| 2012/0104498 A1 * | 5/2012 | Majumdar | ........ | H01L 29/66545 257/351 |
| 2012/0313144 A1 * | 12/2012 | Zhang | ..................... | H01L 21/84 257/192 |
| 2013/0069159 A1 * | 3/2013 | Cheng | ............... | H01L 29/41775 257/347 |
| 2013/0146953 A1 * | 6/2013 | Cheng | ................... | H01L 21/84 257/296 |
| 2013/0187205 A1 * | 7/2013 | Adam | ............. | H01L 21/823807 257/288 |
| 2013/0193522 A1 | 8/2013 | Kwon et al. | | |
| 2013/0295730 A1 * | 11/2013 | Adam | ..................... | H01L 21/84 438/151 |
| 2014/0035000 A1 * | 2/2014 | Ontalus | ................. | H01L 29/665 257/192 |
| 2014/0117368 A1 * | 5/2014 | Haensch | ........... | H01L 29/66636 257/66 |
| 2014/0145246 A1 * | 5/2014 | Ning | ..................... | H01L 29/812 257/280 |
| 2014/0203360 A1 * | 7/2014 | Cao | ................. | H01L 29/41733 257/347 |
| 2014/0203363 A1 * | 7/2014 | Adam | ............. | H01L 29/66742 257/347 |
| 2014/0327054 A1 * | 11/2014 | Adam | ................. | H01L 29/6656 257/288 |
| 2014/0346600 A1 * | 11/2014 | Cheng | ................. | H01L 29/7849 257/347 |
| 2015/0091086 A1 * | 4/2015 | Lu | ........................ | H01L 29/7833 257/336 |
| 2015/0206754 A1 * | 7/2015 | Horak | ............... | H01L 21/28008 257/288 |
| 2015/0270142 A1 * | 9/2015 | Liu | ........................ | H01L 21/321 257/369 |
| 2015/0270343 A1 * | 9/2015 | Cheng | ................. | H01L 27/0922 257/192 |
| 2015/0333068 A1 * | 11/2015 | Toh | ..................... | H01L 27/1027 257/107 |

* cited by examiner

NON-UNIFORM GATE DIELECTRIC FOR U-SHAPE MOSFET

BACKGROUND

The present application relates to a semiconductor structure and a method of forming the same. More particularly, the present application relates to a U-shape gate dielectric structure for use as a component of a functional gate structure which includes a vertical gate dielectric wall portion that has a wall thickness along a lateral direction that is greater than a vertical thickness, i.e., height, of a bottommost gate dielectric portion of the U-shaped gate dielectric structure.

Field effect transistors (FETs) containing functional gate structures are the basic building block of today's integrated circuits. Such functional gate structures include a gate dielectric material and a gate conductor. With scaling of the functional gate structure pitch, there is not enough room for the gate conductor of such devices. As such, functional gate structures containing a U-shaped gate dielectric have been developed. In such functional gate structures, the U-shaped gate dielectric has a wall thickness along the lateral direction that is the same as the vertical thickness of the horizontal gate dielectric portion of the U-shaped gate dielectric. Generally, the uniform thickness is a thin as possible so as to improve device performance. However, such U-shaped gate dielectrics provide extra capacitance to the device.

As such, there is a need to provide a semiconductor structure that has benefits of a U-shaped gate dielectric, without the unwanted capacitance increase that is associated with prior art U-shaped gate dielectrics.

SUMMARY

A U-shaped gate dielectric structure is provided that has a horizontal gate dielectric portion having a vertical thickness, and a vertical gate dielectric wall portion extending upwards from the horizontal gate dielectric portion. The vertical gate dielectric wall portion has a lateral thickness that is greater than the vertical thickness of the horizontal gate dielectric portion. The U-shaped gate dielectric structure houses a gate conductor portion. Collectively, the U-shaped gate dielectric structure and the gate conductor portion provide a functional gate structure that has reduced capacitance.

In one aspect of the present application, a semiconductor structure is provided. In one embodiment of the present application, the semiconductor structure includes a functional gate structure located on a semiconductor material portion. The functional gate structure of the present application comprises a U-shaped gate dielectric structure and a gate conductor portion. The U-shaped gate dielectric structure includes a horizontal gate dielectric portion having a vertical thickness, and a vertical gate dielectric wall portion extending upwards from and surrounding exposed sidewalls of the horizontal gate dielectric portion. The vertical gate dielectric wall portion has a lateral thickness that is greater than the vertical thickness of the horizontal gate dielectric portion. The gate conductor portion of the functional gate structure is located on the horizontal gate dielectric portion and within an area confined by the vertical gate dielectric wall portion. A source region is located on one side of the functional gate structure and a drain region is located on another side of the functional gate structure. The source region and the drain region each have a topmost surface that is located above a topmost surface of the semiconductor material portion and a topmost surface of the horizontal gate dielectric portion.

In another aspect of the present application, methods of forming a semiconductor structure are provided. In one embodiment of the present application, the method includes forming a gate material stack on a semiconductor material portion. The gate material stack comprises, from bottom to top, a horizontal gate dielectric portion and a gate conductor portion, wherein the horizontal gate dielectric portion has a vertical thickness. A vertical gate dielectric wall portion is then formed surrounding sidewalls of the gate material stack. In accordance with the present application, the vertical gate dielectric wall portion extends upward from the horizontal gate dielectric portion and has a lateral thickness that is greater than the vertical thickness of the horizontal gate dielectric portion. Next, a source-side semiconductor material is formed on one side of the gate material stack and a drain-side semiconductor material is formed on another side of the gate material side. In accordance with the present application, a sidewall edge of each of the source-side semiconductor material and the drain-side semiconductor material contacts an outer sidewall of the vertical gate dielectric wall portion.

In another embodiment, the method includes forming a sacrificial gate structure on a semiconductor material portion. Next, a source region is formed on one side of the sacrificial gate structure and on a surface of the semiconductor material portion, and a drain region is formed on another side of the sacrificial gate structure and another surface of the semiconductor material portion. Dopants are then diffused from the source region into the semiconductor material portion to provide a source diffusion region, and dopants from the drain region are diffused into the semiconductor material to provide a drain diffusion region. A dielectric material is then formed on the source region and the drain region. In accordance with the present application, the dielectric material has a topmost surface that is coplanar with a topmost surface of the sacrificial gate structure. Next, a gate cavity is formed by removing the sacrificial gate structure. A recessed channel region is then provided at a bottom of the gate cavity by etching an exposed portion of the semiconductor material portion. Next, an outer vertical gate dielectric wall segment is formed along each sidewall of the gate cavity and the recessed channel region. A gate dielectric material having a vertical wall segment extending from a horizontal portion is then formed. In accordance with the present application, the horizontal portion contacts a remaining surface of the semiconductor material portion in the recessed channel region. A gate conductor portion is thereafter formed in a remaining volume of the gate cavity and the recessed channel region and contacting the horizontal portion and vertical wall segment of the gate dielectric material. In accordance with this embodiment, the combined lateral thickness of the outer vertical gate dielectric wall segment and the vertical wall segment is greater than a vertical thickness of the horizontal portion.

DETAILED DESCRIPTION

Figure 1:
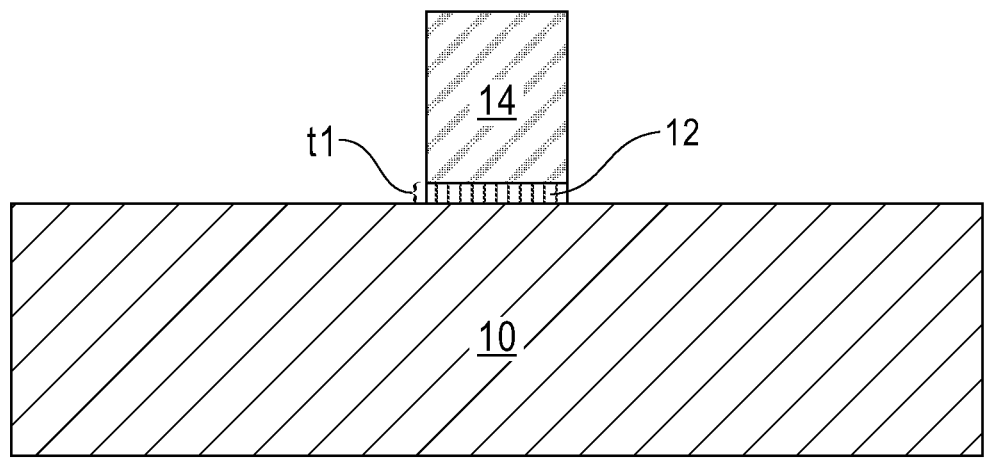
FIG. 1 is a cross sectional view of an exemplary semiconductor structure including a gate material stack of, from bottom to top, a horizontal gate dielectric portion and a gate conductor portion located on a semiconductor material portion in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a gate material stack of, from bottom to top, a horizontal gate dielectric portion 12 and a gate conductor portion 14 located on a semiconductor material portion 10 in accordance with an embodiment of the present application.

In some embodiments of the present application, the semiconductor material portion 10 can constituent all of, or an upper portion of, a bulk semiconductor substrate. The term "bulk semiconductor substrate" denotes a substrate that is entirely composed of at least one semiconductor material. When a bulk semiconductor substrate is employed as semiconductor material portion 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the bulk semiconductor substrate that can provide the semiconductor material portion 10 can be comprised of a single crystalline semiconductor material, such as, for example, single crystalline silicon. In other embodiments, the bulk semiconductor substrate that can provide the semiconductor material portion 10 may comprise a polycrystalline or amorphous semiconductor material.

In another embodiment, the semiconductor material portion 10 may comprise a topmost semiconductor layer of a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In another example, the thickness of the topmost semiconductor layer of the SOI substrate can be from 50 nm to 70 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

In some embodiments of the present application, semiconductor material portion 10 may be doped, undoped or contain doped and undoped regions therein. For clarity, the doped regions are not specifically shown in the drawings of the present application. Each doped region within the semiconductor material portion 10 may have the same, or they may have different conductivities and/or doping concentrations. The doped regions that are present in the semiconductor material portion 10 are typically referred to as well regions and they are formed utilizing a conventional ion implantation process or gas phase doping.

In some embodiments (not shown), the semiconductor material portion 10 may be a semiconductor fin that is formed from a substrate (either bulk or SOI). The term "fin" refers to a contiguous structure including a semiconductor material, such as silicon, and including a pair of vertical sidewalls that are parallel to each other. As used herein, a surface is "vertical" if there exists a vertical plane from which the surface does not deviate by more than three times the root mean square roughness of the surface. In one embodiment of the present application, the semiconductor fin can have a height from 10 nm to 100 nm, and a width from 4 nm to 30 nm. In another embodiment of the present application, the semiconductor fin can have a height from 15 nm to 50 nm, and a width from 5 nm to 12 nm. In some embodiments, a single semiconductor fin is formed. In yet other embodiments, a plurality of semiconductor fins. The semiconductor fin or plurality of semiconductor fins may stand upon a remaining portion of a bulk semiconductor substrate or an insulator layer of an SOI substrate.

In embodiments in which the semiconductor material portion 10 is a semiconductor fin, the semiconductor fin can be formed by patterning an upper portion of a bulk semiconductor substrate or a topmost semiconductor layer of an SOI substrate. In one embodiment, the patterning process used in forming the semiconductor fin may include lithography and etching. Lithography includes forming a photoresist (not shown) on the topmost surface of either the bulk semiconductor substrate or SOI substrate, exposing the photoresist to a desired pattern of radiation, and then developing the exposed photoresist with a resist developer to provide a patterned photoresist atop the bulk semiconductor substrate or SOI substrate. At least one etch is then employed which transfers the pattern from the patterned photoresist into the bulk semiconductor substrate or SOI substrate. In one embodiment, the etch used for pattern transfer may include a dry etch process such as, for example, reactive ion etching, plasma etching, ion beam etching or laser ablation. In another embodiment, the etch used for pattern transfer may include a wet chemical etchant. In yet another embodiment, a combination of a dry etch and a wet chemical etch may be used to transfer the pattern. After transferring the pattern into the material layers, the patterned photoresist can be removed utilizing a resist stripping process such as, for example, ashing. In one embodiment, the patterning process used in forming the semiconductor fin may include a sidewall image transfer process as is well known to those skilled in the art.

Gate material stack (12, 14) is then formed on the semiconductor material portion 10. In some embodiments, the gate material stack (12, 14) is formed in contact with a single surface of the semiconductor material portion 10. In yet other embodiments and when the semiconductor material portion 10 is a semiconductor fin, the gate material stack straddles the semiconductor material portion 10 and thus may contact two or three surfaces of the semiconductor material portion 10.

As stated above, gate material stack (12, 14) includes, from bottom to top, the horizontal gate dielectric portion 12 and the gate conductor portion 14. The horizontal gate dielectric portion 12 includes a portion of a gate dielectric material (described herein below), while the gate conductor portion 14 includes a portion of a gate conductor material (also described herein below). As is illustrated, the horizontal gate dielectric portion 12 has sidewall surfaces that are vertically coincident to sidewall surfaces of the gate conductor portion 14.

The gate dielectric material and the gate conductor material which provide the gate material stack (12, 14) are formed as blanket layers on the semiconductor material portion 10. The blanket layers of gate dielectric material and gate conductor material are then patterned to provide the gate material stack (12, 14). Although a single gate material stack (12, 14) is described and illustrated, a plurality of gate material stacks can be formed at this point of the present application.

In this embodiment of the present application, the gate material stack (12, 14) is used in providing a functional gate structure. The term "functional gate structure" is used throughout the present application as a permanent gate structure used to control output current (i.e., flow of carriers in the channel) of a semiconducting device through electrical or magnetic fields.

The gate dielectric material that can be used in the present application to provide the horizontal gate dielectric portion 12 can be a semiconductor oxide, a semiconductor nitride, and/or a semiconductor oxynitride. In one example, the gate dielectric material that can be used to provide the horizontal gate dielectric portion 12 can be composed of silicon dioxide, silicon nitride and/or silicon oxynitride. In another embodiment of the present application, the gate dielectric material that can be used to provide the horizontal gate dielectric portion 12 may include at least a dielectric metal oxide. Exemplary dielectric metal oxides that can be used as the gate dielectric material that can provide the horizontal gate dielectric portion 12 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the horizontal gate dielectric portion 12.

In some embodiments of the present application, the gate dielectric material that provides the horizontal gate dielectric portion 12 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the horizontal gate dielectric portion 12 can be formed by a thermal growth technique such as, for example, thermal oxidation and/or thermal nitridation. In yet a further embodiment of the present application, a combination of a deposition and thermal growth may be used in forming a multilayered gate dielectric structure that can provide the horizontal gate dielectric portion 12.

In one embodiment of the present application, the gate dielectric material that provides the horizontal gate dielectric portion 12 can have a vertical thickness (i.e., as measured from a bottommost surface to a topmost surface that are orientated parallel to a surface of the underlying semiconductor material portion 10) in a range from 1 nm to 10 nm. In the drawing, t1 represents the vertical thickness of the gate dielectric portion 12. Other vertical thicknesses that are lesser than or greater than the aforementioned thickness range can also be employed for the horizontal gate dielectric portion 12.

The gate conductor material that provides the gate conductor portion 14 can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor material that provides the gate conductor portion 14 is comprised of a doped polysilicon or doped polysilicon germanium. In another embodiment, a lower portion of the gate conductor material that provides the gate conductor portion 14 is comprised a conductive material other than doped polysilicon or doped polysilicon germanium, and an upper portion of the gate conductor material that provides the gate conductor portion 14 is comprised of doped polysilicon or doped silicon germanium.

The gate conductor material that provides the gate conductor portion 14 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor material that provides the gate conductor portion 14 has a vertical thickness from 1 nm to 100 nm. Other thicknesses that are lesser than or greater than the aforementioned thickness range can also be employed for the gate conductor material that provides the gate conductor portion 14.

The patterning of the material stack including the blanket layers of gate dielectric material and gate conductor material can be performed utilizing lithography and etching. The lithographic step employed in patterning the material stack including the gate dielectric material and the gate conductor material is the same as described above except that the patterned photoresist is formed on a topmost surface of the gate conductor material. At least one etch is then employed which transfers the pattern from the patterned photoresist into the various materials. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing.

Figure 2:
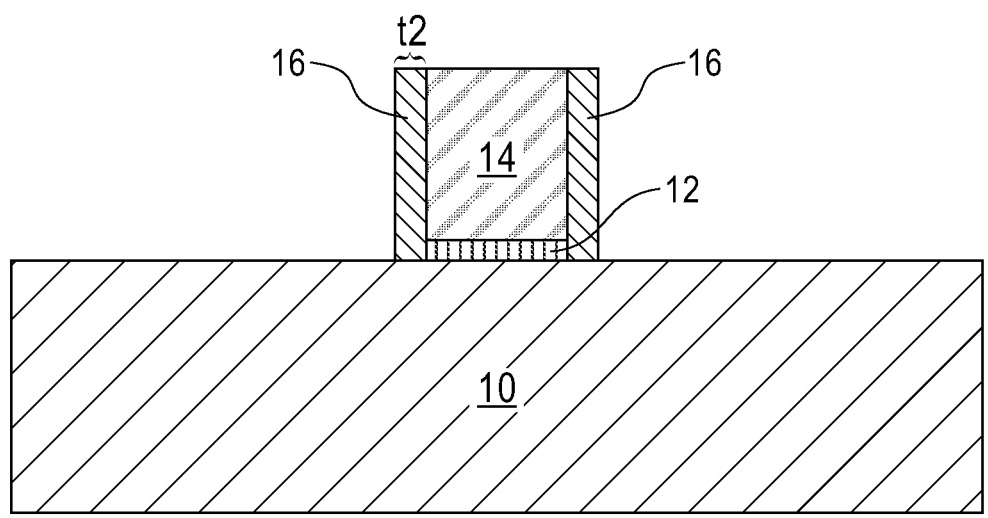
FIG. 2 is a cross sectional view of the exemplary semiconductor structure of FIG. 1 after forming a vertical gate dielectric wall portion surrounding the sidewalls of the gate material stack, wherein a lateral thickness of the vertical gate dielectric wall portion is greater than a vertical thickness of the horizontal gate dielectric portion.

Referring now to FIG. 2, there is illustrated the exemplary semiconductor structure of FIG. 1 after forming a vertical gate dielectric wall portion 16 surrounding the sidewalls of the gate material stack (12, 14). Notably, the vertical gate dielectric wall portion 16 is in direct contact with sidewall surfaces of the horizontal gate dielectric portion 12 and the gate conductor portion 14. The vertical gate dielectric wall portion 16 extends upward from the gate conductor portion 14. Collectively, the horizontal gate dielectric portion 12 and vertical gate dielectric wall portion 16 form a contiguous U-shaped gate dielectric structure of the present application. The area defined above the horizontal gate dielectric portion 12 and between the vertical gate dielectric wall portion 16 houses the gate conductor portion 14.

In the present application, the vertical gate dielectric wall portion 16 has a topmost surface that is coplanar with a topmost surface of the gate conductor portion 14, a bottommost surface that forms an interface with a surface of the semiconductor material portion 10, and a lower sidewall portion that directly contacts vertical sidewall surfaces of the horizontal gate dielectric portion 12.

In accordance with the present application, the vertical gate dielectric wall portion 16 has a lateral thickness, t2, which is greater than a vertical thickness, t1, of the horizontal gate dielectric portion 12. The term "lateral thickness" denotes a thickness of a material from one sidewall to another sidewall; the sidewalls are perpendicular to a topmost surface of the semiconductor material portion 10. Other lateral thicknesses that are lesser than or greater than the aforementioned thickness range can also be employed for the vertical gate dielectric wall portion 16 so long as the lateral thickness, t2, of the vertical gate dielectric wall portion 16 is greater than the vertical thickness, t1, of the horizontal gate dielectric portion 12.

The vertical gate dielectric wall portion 16 may include one of the gate dielectric materials mentioned above for the horizontal gate dielectric portion 12. In some embodiments, the vertical gate dielectric wall portion 16 may have a dielectric constant that is less than silicon dioxide. In one embodiment of the present application, the horizontal gate dielectric portion 12 and the vertical gate dielectric wall portion 16 comprise a same gate dielectric material. In another embodiment, the horizontal gate dielectric portion 12 and the vertical gate dielectric wall portion 16 comprise different gate dielectric materials.

The vertical gate dielectric wall portion 16 can be formed by first depositing one of the gate dielectric materials mentioned above in providing the horizontal gate dielectric portion 12. The deposition of the gate dielectric material that provides the vertical gate dielectric wall portion 16 may include one of the deposition processes mentioned above in providing the gate dielectric material of the horizontal gate dielectric portion 12. Following deposition of the gate dielectric material, an anisotropic etching process, such as, for example, reactive ion etching, can be employed to provide the vertical gate dielectric wall portion 16.

Figure 3:
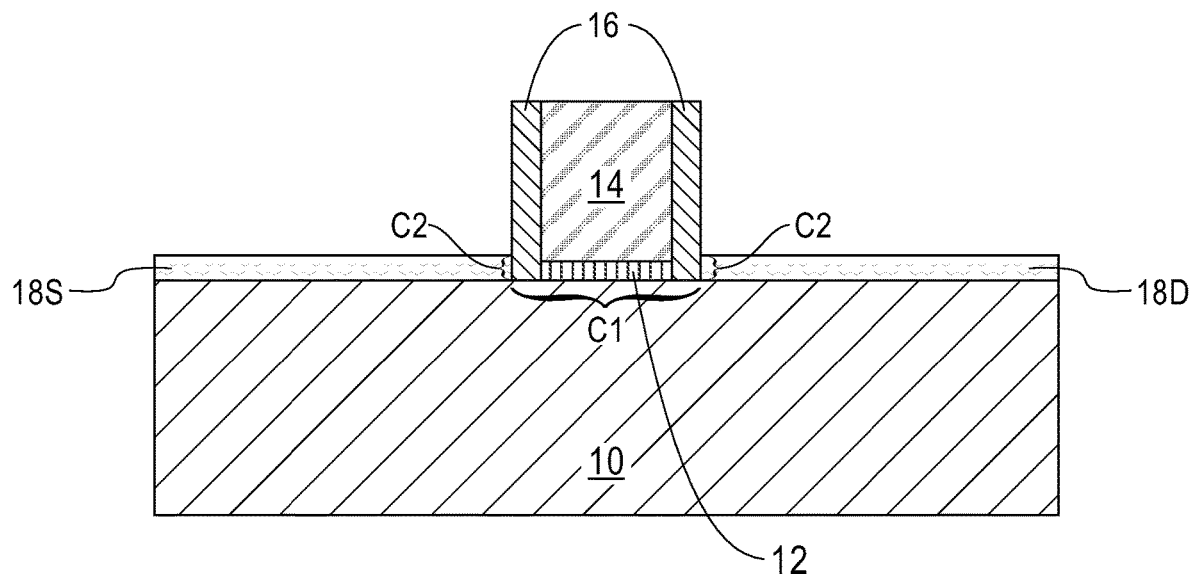
FIG. 3 is a cross sectional view of the exemplary semiconductor structure of FIG. 2 after epitaxially growing a source-side semiconductor material on an exposed surface of the semiconductor material portion and on one side of the gate material stack and a drain-side semiconductor material on another exposed surface of the semiconductor material portion and on another side of the gate material stack.

Referring now to FIG. 3, there is illustrated the exemplary semiconductor structure of FIG. 2 after epitaxially growing a source-side semiconductor material 18S on exposed surface of the semiconductor material portion 10 and on one side of the gate material stack, and forming a drain-side semiconductor material 18D on another exposed surface of the semiconductor material portion 10 and on another side of the gate material stack. As is shown, each of the source-side and drain-side semiconductor materials 18S, 18D has a bottommost surface that forms an interface with the topmost surface of the semiconductor material portion 10, at least one sidewall surface that contacts a lower outer sidewall portion of the vertical gate dielectric wall portion 16, and a topmost surface that is beneath a topmost surface of the gate conductor portion 14.

Each of the source-side and drain-side semiconductor materials 18S and 18D comprises one of the semiconductor materials mentioned above for the semiconductor material portion 10. In one embodiment of the present application, each of the source-side and drain-side semiconductor materials 18S and 18D and the semiconductor material portion 10 can comprise a same semiconductor material. In one example, each of the source-side and drain-side semiconductor materials 18S and 18D and the semiconductor material portion 10 can comprise silicon. In another embodiment of the present application, each of the source-side and drain-side semiconductor materials 18S and 18D and the semiconductor material portion 10 can comprise a different semiconductor material. In one example, the semiconductor material portion 10 may comprise silicon, while each of the source-side and drain-side semiconductor materials 18S and 18D may comprise a silicon germanium alloy or germanium. In some embodiments of the present application, the source-side semiconductor material 18S comprises a same semiconductor material as the drain-side semiconductor material 18D. In other embodiments of the present application, the source-side semiconductor material 18S may comprise a different semiconductor than the drain-side semiconductor material 18D. Typically, the source-side and drain-side semiconductor material 18S, 18D will have the same dopant type (i.e., n-type or p-type) as semiconductor material portion 10.

As indicated above, the source-side and the drain-side semiconductor material 18S, 18D are formed by an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Thus, and in the present application, semiconductor material that provides the source-side and drain-side semiconductor materials 18S, 18D has a same crystalline characteristic as the semiconductor material portion 10. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking. When different semiconductor materials are epitaxially grown, block mask technology can be used.

A number of different source gases, which are well known to those skilled in the art, may be used for the deposition of the semiconductor material that provides the source-side and drain-side semiconductor material 18S, 18D. In one example, a silane can be used as a silicon source gas. Carrier gases like hydrogen, nitrogen, helium and argon can be used. In some embodiments, an n-type dopant or a p-type dopant can be present with the source gas that provides the source-side and drain-side semiconductor material 18S, 18D. In some embodiments, an n-type dopant or a p-type dopant can be introduced into the source-side and drain-side semiconductor material 18S, 18D by ion implantation or gas phase doping after the deposition process. The term "p-type" refers to the addition of impurities to an intrinsic semiconductor that creates deficiencies of valence electrons. "N-type" refers to the addition of impurities that contributes free electrons to an intrinsic semiconductor. In some embodiments, the dopant may be introduced by ion implantation, plasma doping or gas phase doping. The concentration of dopants that can be introduced into the source-side and drain-side semiconductor material 18S, 18D can range from 5E18 atoms/cm$^3$ to 1.5E21 atoms/cm$^3$.

In accordance with the present application, the functional gate structure has two channel regions. The first channel region, C1, is located directly beneath the gate material stack (12, 14) and is located in the semiconductor material portion 10. The first channel region, C1, has a first channel length. A second channel region, C2, is located in a portion of the semiconductor material 18S 18D that is located on the outer sidewalls of the vertical gate dielectric wall portion 16. The second channel region, C2, has a second channel length. Here, the total gate length is equal to the first channel length+2(second channel length).

Figure 4:
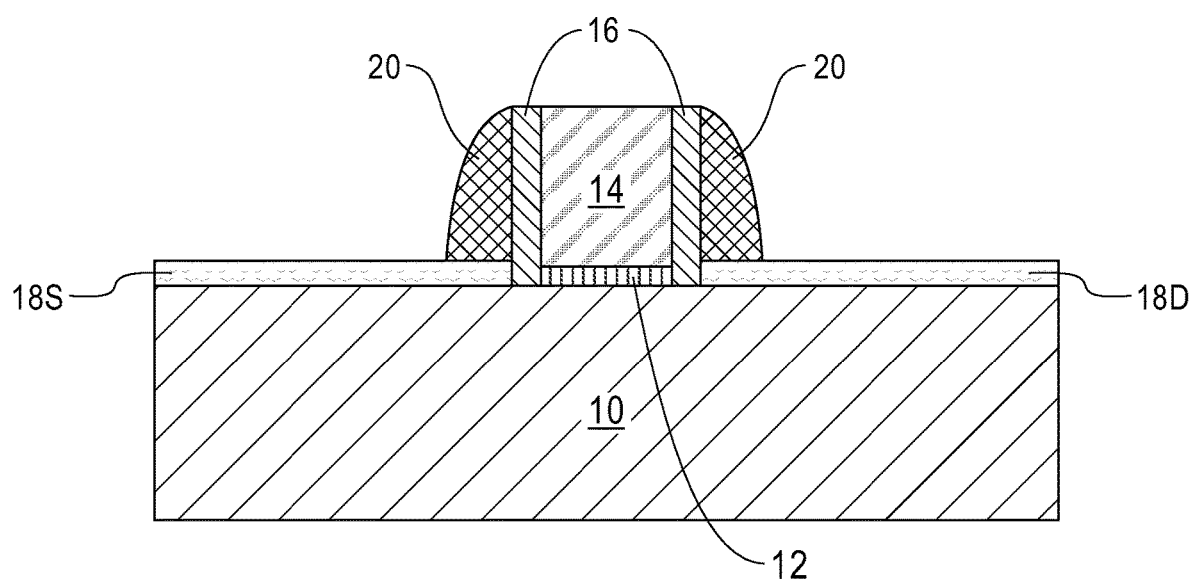
FIG. 4 is a cross sectional view of the exemplary semiconductor structure of FIG. 3 after formation of a dielectric spacer on outer sidewalls of the vertical gate dielectric wall portion and on a surface of the both the source-side and drain-side semiconductor materials.

Referring now to FIG. 4, there is illustrated the exemplary semiconductor structure of FIG. 3 after formation of a dielectric spacer 20 on vertical sidewalls, i.e., outer vertical sidewalls, of the vertical gate dielectric wall portion 16 and on a surface of the source-side and drain-side semiconductor material 18S, 18D. The dielectric spacer 20 typically comprises an insulator that differs in terms of composition from the gate dielectric material that provides the horizontal gate dielectric portion 14 and the vertical gate dielectric wall portion 16. The dielectric spacer material may include an oxide, a nitride and/or an oxynitride. In one example, the dielectric spacer material is silicon dioxide or silicon nitride. The dielectric spacer material can be formed utilizing a deposition process such as, for example, chemical vapor deposition (CVD), plasma enhanced chemical vapor deposition (PECVD) or physical vapor deposition (PVD). Etching of the dielectric spacer material may comprise a dry etch or a chemical wet etch.

Figure 5:
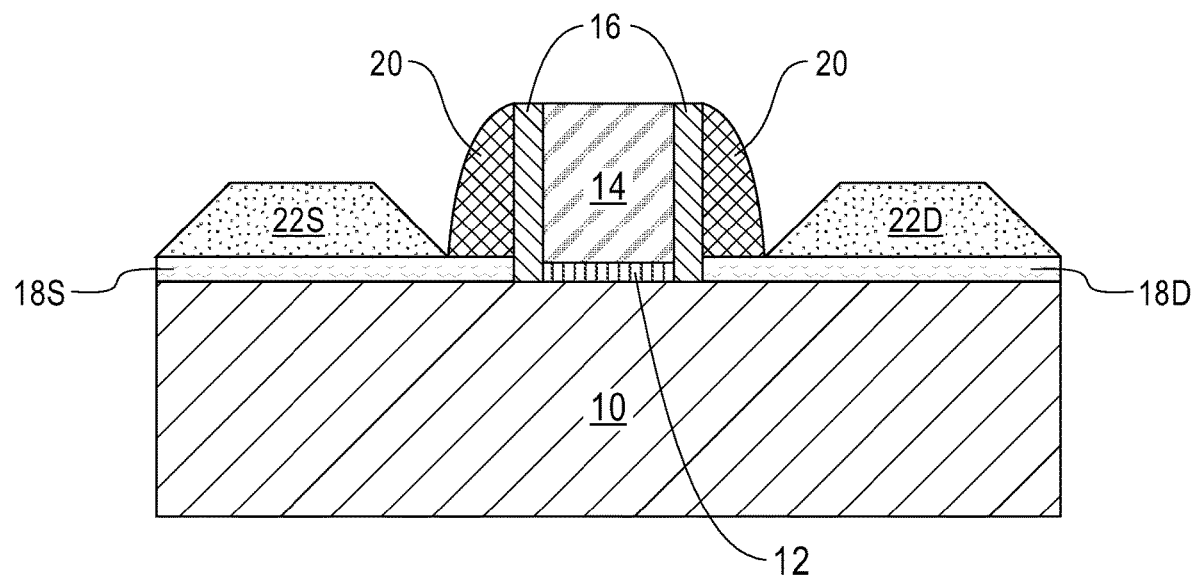
FIG. 5 is a cross sectional view of the exemplary semiconductor structure of FIG. 4 after formation of a source region and a drain region.

Referring now to FIG. 5, there is illustrated the exemplary semiconductor structure of FIG. 4 after formation of a source region 22S and a drain region 22D. As shown, the source region 22S is formed on one side of the gate material stack (10, 12) and on a surface of the source-side semiconductor material 18S, and the drain region 22D is formed on another side of the gate material stack (10, 12) and on a surface of the drain-side semiconductor material 18D. The source region 22S and drain region 22D are spaced apart from the gate material stack (10, 12) by the vertical gate dielectric wall portion 16 and the dielectric spacer 20.

The source region 22A and the drain region 22B comprise a semiconductor material that is doped. In one embodiment, the source region 22S and the drain region 22D comprise a same semiconductor material. In another embodiment, the source region 22S and the drain region 22D comprise a different semiconductor material. In some embodiments, the semiconductor material that provides the source region 22S and the drain region 22D may be a same semiconductor material as the underlying source-side and drain-side semiconductor material 18S, 18D. In other embodiments, the semiconductor material that provides the source region 22S and the drain region 22D comprises a different semiconductor material than that of source-side and drain-side semiconductor material 18S, 18D. In yet other embodiments, at least one of the source region 22S or the drain region 22D comprises a same semiconductor material as the semiconductor material that provides the source-side or drain-side-semiconductor material 18S, 18D, while the other of the source region 22S or the drain region 22D comprises a different semiconductor material than semiconductor material that provides the source-side or drain-side-semiconductor material 18S, 18D.

The semiconductor material that provides the source region 22S and the drain region 22D can be formed by an epitaxial deposition (i.e., growth) process as mentioned above. In embodiments in which the source region 22S and the drain region 22D comprise a different semiconductor material, block mask technology can be used. In some embodiments, a selective epitaxial growth process can be used. In some embodiments, dopants (n-type or p-type) can be introduced into the reactant source gas that provides the semiconductor material for the source region 22S and the drain region 22D. In other embodiments, dopants (n-type or p-type) can be introduced into the semiconductor material that the source region 22S and the drain region 22D after epitaxial deposition of the semiconductor material. The concentration of dopants used in providing the source region 22S and drain region 22D can range from 5E18 atoms/cm$^3$ to 1.5E21 atoms/cm$^3$. The source region 22S and drain region 22D have a topmost surface that is located above a topmost surface of the semiconductor material portion 10 and a topmost surface of the horizontal gate dielectric portion 12.

At this point of the present application, and in some embodiments of the present application, an anneal may be performed that causes dopants to diffusion out of the source region 22S and drain region 22D and into the underlying semiconductor material 18 and semiconductor material portion 10.

FIG. 5 illustrates a semiconductor structure in accordance with the present application. The semiconductor structure includes a functional gate structure located on a semiconductor material portion 10. The functional gate structure of the present application comprises a U-shaped gate dielectric structure and a gate conductor portion 14. The U-shaped gate dielectric structure includes a horizontal gate dielectric portion 12 having a vertical thickness, and a vertical gate dielectric wall portion 16 extending upwards from and surrounding exposed sidewalls of the horizontal gate dielectric portion 12. The vertical gate dielectric wall portion 16 has a lateral thickness that is greater than the vertical thickness of the horizontal gate dielectric portion 12. The gate conductor portion 14 of the functional gate structure is located on the horizontal gate dielectric portion 12 and within an area confined by the vertical gate dielectric wall portion 16. A source region 22S is located on one side of the functional gate structure and a drain region 22D is located on another side of the functional gate structure. The source region 22S and the drain region 22D each have a topmost surface that is located above a topmost surface of the semiconductor material portion 10 and a topmost surface of the horizontal gate dielectric portion 12. The U-shaped gate dielectric structure (12, 16) of the present application provides reduced capacitance to the structure as compared to an equivalent semiconductor structure in which a U-shaped gate dielectric having a uniform thickness in the lateral and vertical directions is employed.

The above embodiment of the present application which is illustrated in FIGS. 1-5 represents a gate first process. The following embodiment of the present application which is illustrated in FIGS. 6-14 represents a gate last process. In the gate last process, a sacrificial gate structure is first provided, and then the source region and drain region are formed. The term "sacrificial gate structure" is used throughout the present application to a material or material stack that serves as a placeholder structure for a functional gate structure to be subsequently formed. Following formation of the source region and the drain region, the sacrificial gate structure can be replaced with a functional gate structure.

Figure 6:
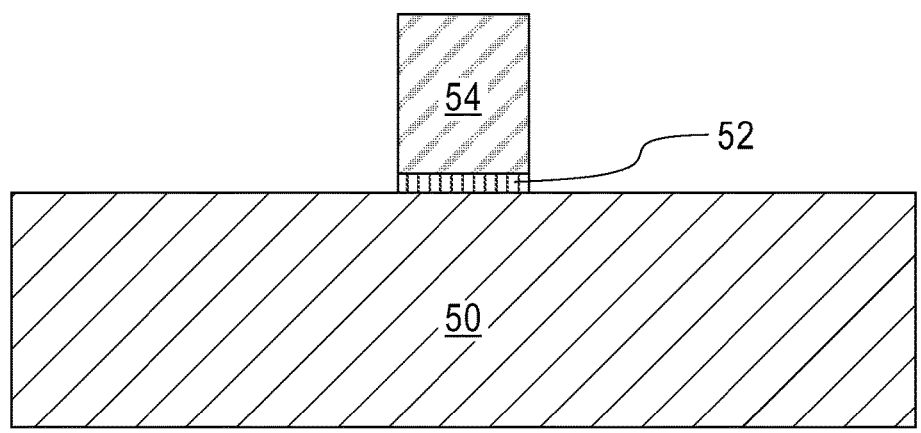
FIG. 6 is a cross sectional view of an exemplary semiconductor structure including a sacrificial gate structure located on a semiconductor material portion in accordance with another embodiment of the present application.

Referring first to FIG. 6, there is illustrated an exemplary semiconductor structure including a sacrificial gate structure located on a surface of a semiconductor material portion 50 in accordance with another embodiment of the present application. Semiconductor material portion 50 that is employed in this embodiment of the present application is the same as that mentioned in the previous embodiment of the present application. Thus, semiconductor material portion 50 can be an upper semiconductor region of a bulk semiconductor substrate, an upper semiconductor layer of an SOI substrate, an upper semiconductor layer of an ETSOI substrate, or a semiconductor fin.

The sacrificial gate structure includes a material stack of, from bottom to top, a sacrificial gate dielectric portion 52 and a second gate conductor portion 54. Although a single sacrificial gate structure (52, 54) is described and illustrated, a plurality of sacrificial gate structures can be formed. In some embodiments, the sacrificial gate dielectric portion 52 can be entirely omitted. In such an embodiment, the entirety of the sacrificial gate structure is comprised of a sacrificial gate conductor portion 54. In the illustrated embodiment, the sacrificial gate dielectric portion 52 has sidewall surfaces that are vertically coincident to sidewall surfaces of the sacrificial gate conductor portion 54.

When present the sacrificial gate dielectric portion 52 may comprise one of the gate dielectric materials mentioned above for the horizontal gate dielectric portion 12. The gate dielectric material that provides the sacrificial gate dielectric portion 52 can be formed as a blanket layer utilizing one of the methods mentioned above in forming the gate dielectric material for the horizontal gate dielectric portion 12. The thickness of the gate dielectric material that may provide the sacrificial gate dielectric portion 52 may be within the range mentioned above for the gate dielectric material that provides the horizontal gate dielectric portion 12.

The sacrificial gate conductor portion 54 may comprise any material that can be selectively removed from the structure during a subsequently performed etching process. In one embodiment, the material that provides the sacrificial gate conductor portion 54 may comprise polysilicon. In another embodiment, the material that provides the sacrificial gate conductor portion 54 may comprise a metal such as, for example, Al, W or Cu. The material that provides the sacrificial gate conductor portion 54 can be formed as a blanket layer utilizing one of the deposition processes mentioned above in forming the gate conductor material that provides the gate conductor portion 14. The thickness of the material that provides the sacrificial gate conductor portion 54 may vary. In one example, the thickness of the material that provides the sacrificial gate conductor portion can be in a range from 50 nm to 300 nm. Other thicknesses that are above, or below, the aforementioned thickness range may also be used as the thickness of the material that provides the sacrificial gate structure 54.

After forming the optional blanket layer of gate dielectric material that provides the sacrificial gate dielectric portion 52 and blanket layer of material that provides the sacrificial gate conductor portion 54, a patterning process can be used to provide the sacrificial gate structure (52, 54). In one example, the patterning process may include lithography and etching. In another example, the patterning process may include a sidewall image transfer (SIT) process as is well known to those skilled in the art.

Figure 7:
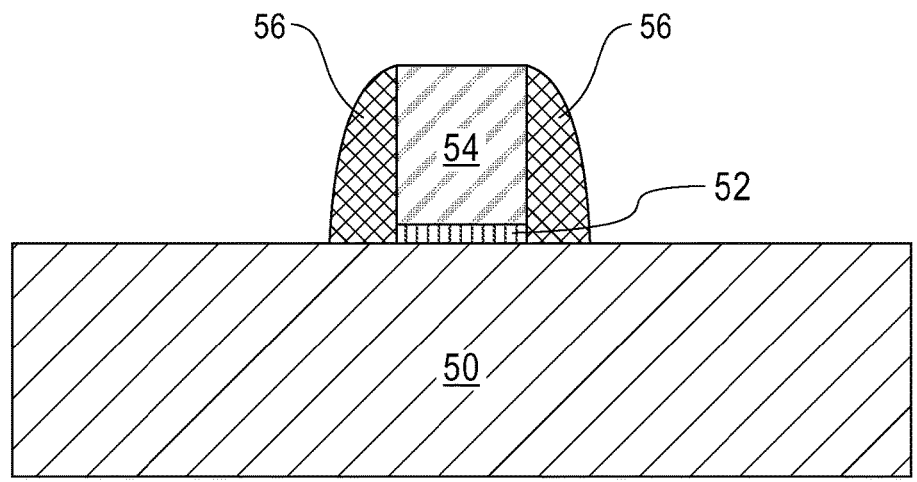
FIG. 7 is a cross sectional view of the exemplary semiconductor structure of FIG. 6 after formation of a dielectric spacer on vertical sidewalls of the sacrificial gate structure.

Referring now to FIG. 7, there is illustrated the exemplary semiconductor structure of FIG. 6 after formation of a dielectric spacer 56 on vertical sidewalls of the sacrificial gate structure (52, 54). Dielectric spacer 56 that is employed in this embodiment of the present application includes one of the dielectric spacer materials mentioned above in providing dielectric spacer 20. Dielectric spacer 56 is formed utilizing the process as mentioned above in forming dielectric spacer 20. In this embodiment of the present application, dielectric spacer 56 has a bottommost surface located on a surface of the semiconductor portion 50 and vertical sidewall surfaces that directly contact the sacrificial gate structure (52, 54).

Figure 8:
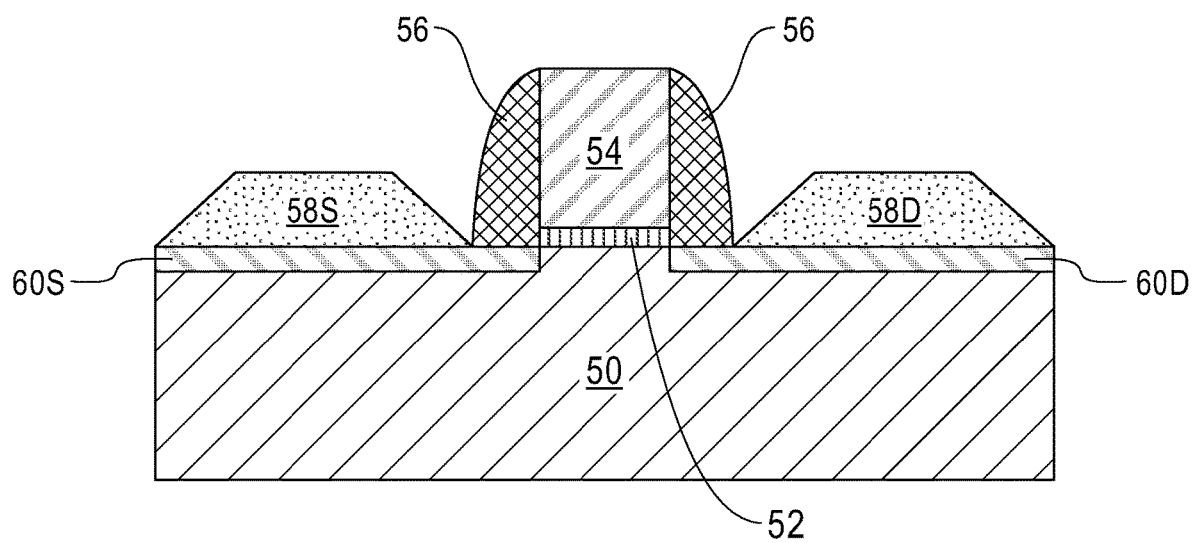
FIG. 8 is a cross sectional view of the exemplary semiconductor structure of FIG. 7 after formation of a source region and a drain region.

Referring now to FIG. 8, there is illustrated the exemplary semiconductor structure of FIG. 7 after formation of source region 58S and a drain region 58D. Source region 58S and drain region 58D of this embodiment of the present application are the same as the source region 20S and the drain region 20D mentioned in the previous embodiment of the present application. Thus, the materials and method described above in forming source region 20S and drain region 20D are applicable here for providing source region 58S and drain region 58D. In this embodiment however, the source region 58S and the drain region 58D have a bottommost surface that is formed on a surface of the semiconductor material portion 50.

Following formation of the source region 58S and drain region 58D, an anneal can be performed that causes diffusion of dopants out of the source region 58S and the drain region 58D and into the underlying semiconductor material portion 50. The diffused dopants provide a source diffusion region 60S and a drain diffusion region 60D in the semiconductor material portion 50, as shown in FIG. 8. The anneal may be performed in an inert ambient such as, for example, helium, argon, and/or neon, and temperature from 500° C. to 800° C. may be used.

Figure 9:
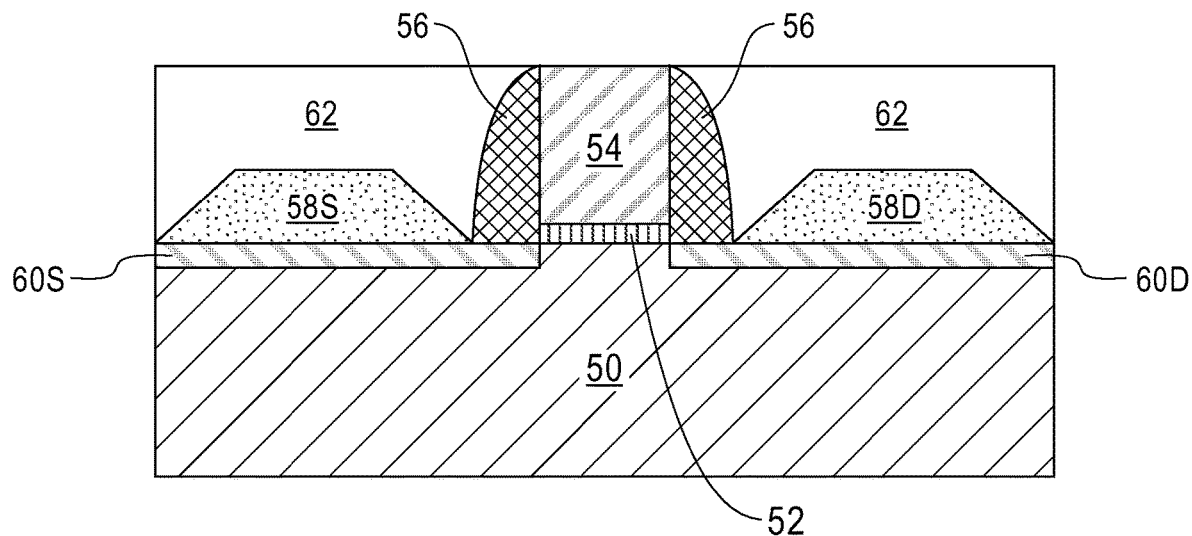
FIG. 9 is a cross sectional view of the exemplary semiconductor structure of FIG. 8 after formation of a dielectric material having a topmost surface that is coplanar with a topmost surface of the sacrificial gate structure.

Referring now to FIG. 9, there is illustrated the exemplary semiconductor structure of FIG. 8 after formation a dielectric material 62 having a topmost surface that is coplanar with a topmost surface of the sacrificial gate structure (52, 54). The dielectric material 62 that can be employed in the present application may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 62. The use of a self-planarizing dielectric material as dielectric material 62 may avoid the need to perform a subsequent planarizing step.

In one embodiment, the dielectric material 62 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 62, a planarization process or an etch back process follows the deposition of the dielectric material. The thickness of the dielectric material 62 that can be employed in the present application may vary depending on the type of dielectric material employed as well as the method that was employed in forming the same. In one embodiment, the dielectric material 62 has a thickness from 80 nm to 500 nm. Other thicknesses that are greater or lesser than the range provided above can also be used for the dielectric material 62.

Figure 10:
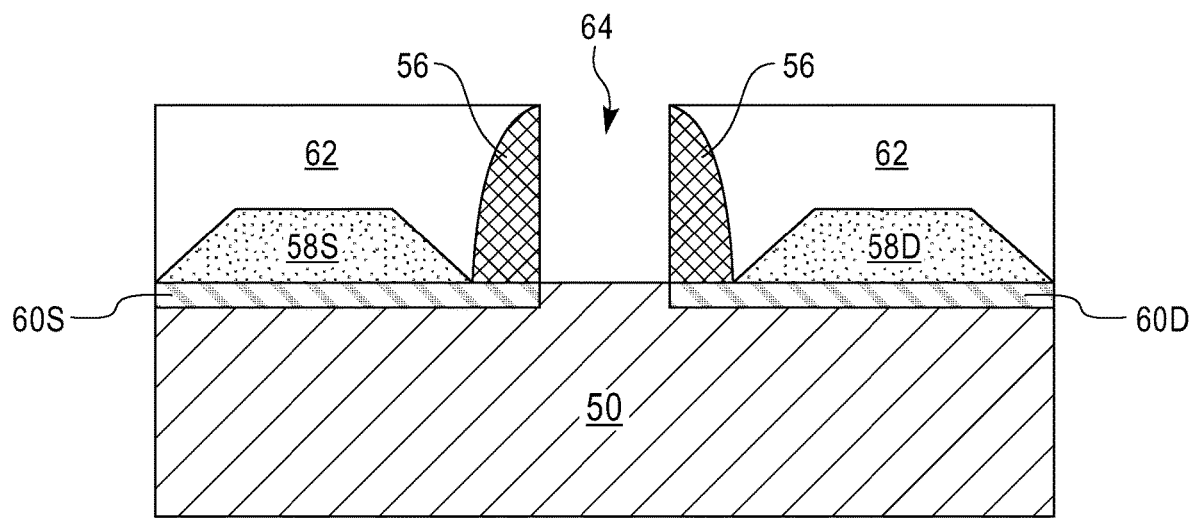
FIG. 10 is a cross sectional view of the exemplary semiconductor structure of FIG. 9 after removing the sacrificial gate structure to provide a gate cavity.

Referring now to FIG. 10, there is illustrated the exemplary semiconductor structure of FIG. 9 after removing the sacrificial gate structure (52, 54) to provide gate cavity 64. The sacrificial gate structure (52, 54) can be removed by employing at least one etching process. In one example, a reactive ion etch can be used to removal the entirety of the sacrificial gate structure (52, 54). In some embodiments, a first etch can be used to remove the sacrificial gate conductor portion 54, stopping on a surface of the sacrificial gate dielectric portion 52. Another etch can be used to remove the sacrificial gate dielectric portion 52.

Figure 11:
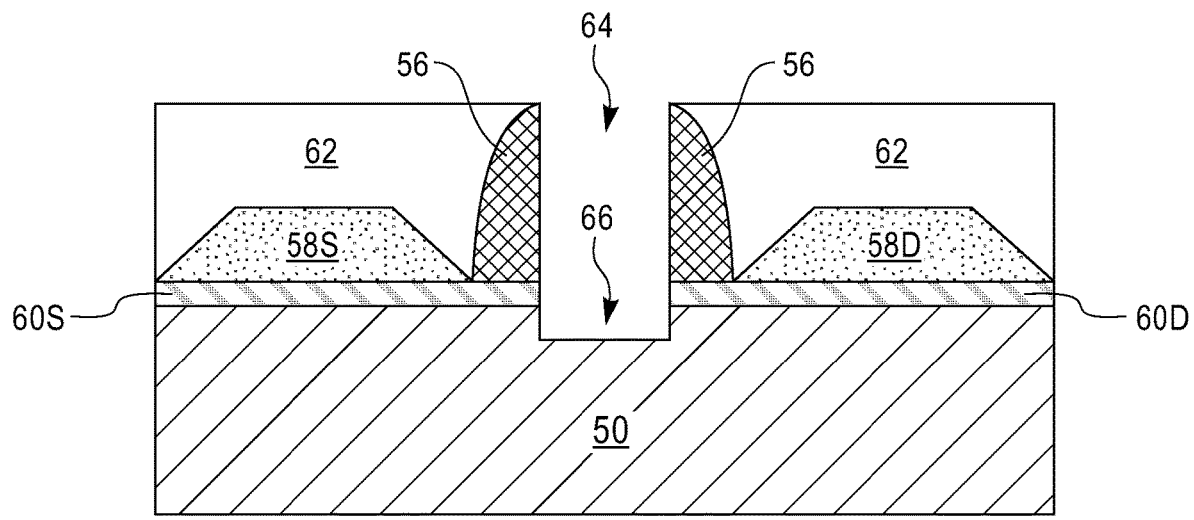
FIG. 11 is a cross sectional view of the exemplary semiconductor structure of FIG. 10 after recessing an exposed region of the semiconductor material portion to provide a recessed channel region.

Referring now to FIG. 11, there is illustrated the exemplary semiconductor structure of FIG. 10 after recessing an exposed region of the semiconductor material portion 50 to provide a recessed channel region 66. In some cases, portions of the source diffusion region 60S and the drain diffusion region 60D can also be removed at this point of the present application. The recessed channel region 66 is an opening that is located directly beneath the gate cavity 64. The recessed channel region 66 exposes sidewalls of the source diffusion region 60S and the drain diffusion region 60D. In some embodiments, and as illustrated, the recessed channel region 66 has a bottommost surface that extends beneath a bottommost portion of the source diffusion region 60S and the drain diffusion region 60D. The recessed channel region 66 can be formed utilizing an isotropic etching process such as, for example, reactive ion etching.

Figure 12:
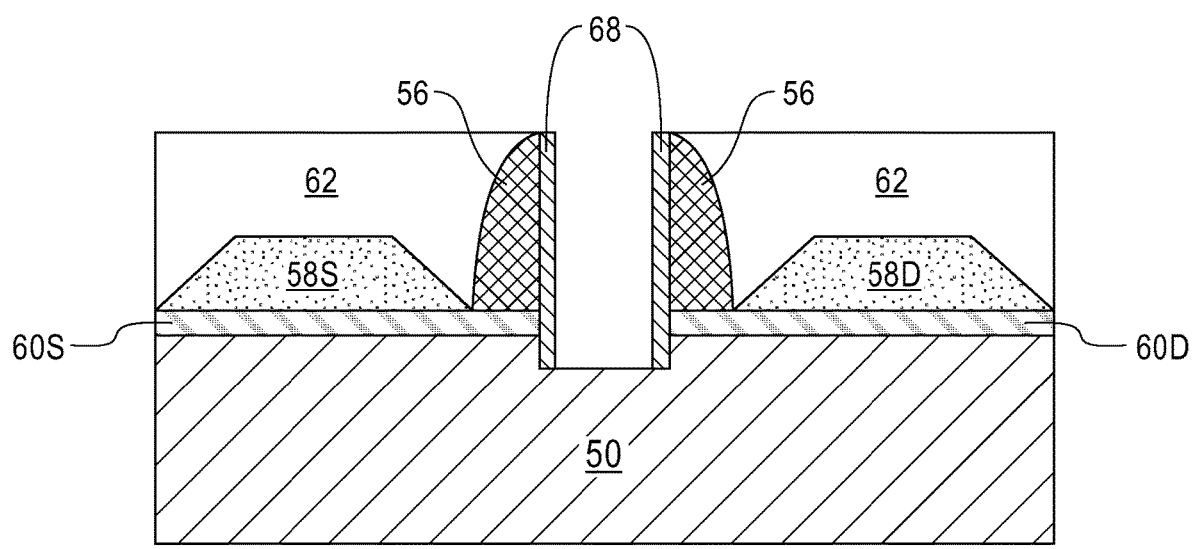
FIG. 12 is a cross sectional view of the exemplary semiconductor structure of FIG. 11 after forming an outer vertical gate dielectric wall segment on exposed sidewalls within the gate cavity and the recessed channel region.

Referring now to FIG. 12, there is illustrated the exemplary semiconductor structure of FIG. 11 after forming an outer vertical gate dielectric wall segment 68 having a first lateral thickness, t3, only on exposed vertical sidewalls within the gate cavity 64 and the recessed channel region 66. The outer vertical gate dielectric wall segment 68 may include one of the gate dielectric materials mentioned above in providing the horizontal gate dielectric portion 12 of the first embodiment of the present application. The outer vertical gate dielectric wall segment 68 can be formed by depositing a gate dielectric material and then an anisotropic etch can be used to remove gate dielectric material from the bottom horizontal surface within the recessed channel region 66.

As is shown, a portion of an outer sidewall of the outer vertical gate dielectric wall segment 68 is in direct contact with an inner vertical sidewall of dielectric spacer 56, another portion of the outer sidewall of the outer vertical gate dielectric wall segment 68 is in direct contact with a sidewall of one of the source diffusion region 60S or the drain diffusion region 60D, and yet another portion of the outer sidewall of the outer vertical gate dielectric wall segment 68 is in direct contact with a sidewall surface of the semiconductor material portion 50. The first lateral thickness, t3, of the outer vertical gate dielectric wall segment 68 can be from 1 nm to 10 nm. Other thicknesses are also possible and can be used as the first lateral thickness, t3, of the outer vertical gate dielectric wall segment 68.

Figure 13:
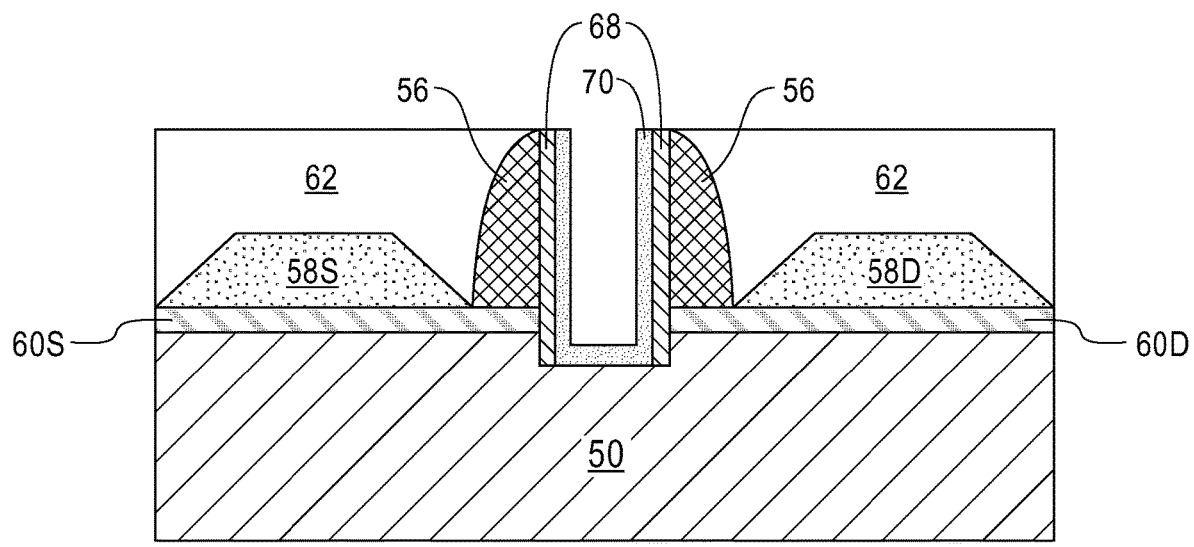
FIG. 13 is a cross sectional view of the exemplary semiconductor structure of FIG. 12 after formation of a gate dielectric material along the sidewalls of the outer vertical gate dielectric wall segment, wherein said gate dielectric material has a vertical wall segment extending upward from a horizontal portion.

Referring now to FIG. 13, there is illustrated the exemplary semiconductor structure of FIG. 12 after formation of a gate dielectric material 70 along inner sidewalls of the outer vertical gate dielectric wall segment 68 and on the exposed surface of the semiconductor material portion 50 within the recessed channel region 66. The gate dielectric material 70 is a conformal layer that includes a horizontal portion having a horizontal thickness, t4, which is equal to a vertical thickness, t5, of a vertical wall segment. The vertical wall segment of gate dielectric material 70 extends upward from the horizontal portion. Thus, gate dielectric material 70 itself is U-shaped.

The gate dielectric material 70 includes one of the gate dielectric materials mentioned above in providing the horizontal gate dielectric portion 12. In some embodiments, the gate dielectric material 70 and the outer vertical gate dielectric wall segment 68 comprise a same gate dielectric material. In other embodiments, the gate dielectric material 70 and the outer vertical gate dielectric wall segment 68 comprise a different gate dielectric material. Gate dielectric material 70 can be formed utilizing one of the deposition processes mentioned above in forming the horizontal gate dielectric portion 12. The gate dielectric material 70 has a thickness that can be the same or different from the lateral thickness of the outer vertical gate dielectric wall segment 68.

Collectively, the outer vertical gate dielectric wall segment 68 and the gate dielectric material 70 provide a contiguous U-shaped gate dielectric structure of the present application. In this embodiment, the outer vertical gate dielectric wall segment 68 and the vertical wall segment of the gate dielectric material 70 provide a vertical gate dielectric wall portion of the U-shaped gate dielectric structure. In accordance with the present application, the lateral thickness of the contiguous U-shaped gate dielectric structure (68, 70) is greater than a vertical thickness of a horizontal gate dielectric portion.

Figure 14:
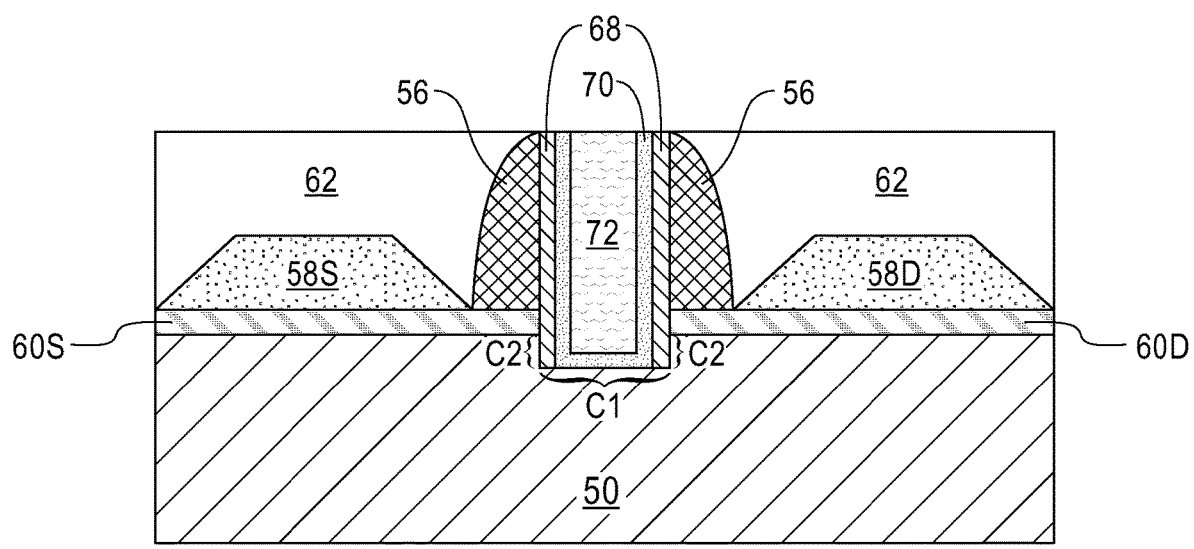
FIG. 14 is a cross sectional view of the exemplary semiconductor structure of FIG. 13 after filling the remaining volume of the gate cavity with a gate conductor material.

Referring now to FIG. 14, there is illustrated the exemplary semiconductor structure of FIG. 13 after filling the remaining volume of the gate cavity 64 with a gate conductor material and planarization. The remaining conductor material within the gate cavity 64 may be referred to herein as gate conductor portion 72. The gate conductor material that can provide gate conductor portion 72 may include one of the conductive materials mentioned above for providing the gate conductor portion 14. The gate conductor material that can provide gate conductor portion 72 may be formed utilizing one of the deposition processes mentioned above in forming the conductive material that provides the gate conductor portion 14. The planarization process may include chemical mechanical planarization and/or grinding. As shown, a topmost surface of the gate conductor portion 72, the vertical portions of the gate dielectric material 70 and the outer vertical gate dielectric wall segment 68 are all coplanar with each other, as well as being coplanar with a topmost surface of dielectric material 60. Collectively, the gate conductor portion 72, the gate dielectric material 70 and the outer vertical gate dielectric wall segment 68 constituent a functional gate structure.

In accordance with the present application, the functional gate structure has two channel regions. The first channel region, C1, is located directly beneath the gate conductor portion 72, the gate dielectric material 70 and the outer vertical gate dielectric wall segment 68 and is located beneath the recessed channel region 66 and in the semiconductor material portion 50. The first channel region, C1, has a first channel length. A second channel region, C2, is located in along a vertical portion of the semiconductor material portion 50 that is located beneath the source/drain diffusion regions 60S, 60D. The second channel region, C2, has a second channel length. Here, the total gate length is equal to the first channel length+2(second channel length).

FIG. 14 illustrates another semiconductor structure in accordance with the present application. The semiconductor structure includes a functional gate structure located on a semiconductor material portion 50. The functional gate structure of the present application comprises a U-shaped gate dielectric structure and a gate conductor portion 72. The U-shaped gate dielectric structure has a horizontal gate dielectric portion (i.e., the horizontal portion of gate dielectric material 70) having a vertical thickness, and a vertical gate dielectric wall portion (combination of the outer vertical gate dielectric wall segment 68 and the vertical wall segment of gate dielectric material 70) extending upwards from and surrounding exposed sidewalls of the horizontal gate dielectric portion. The vertical gate dielectric wall portion (combination of the outer vertical gate dielectric wall segment 68 and the vertical wall segment of gate dielectric material 70) has a lateral thickness that is greater than the vertical thickness of the horizontal gate dielectric portion. The gate conductor portion 72 of the functional gate structure is located on the horizontal gate dielectric portion and within an area confined by the vertical gate dielectric wall portion (combination of the outer vertical gate dielectric wall segment 68 and the vertical wall segment of gate dielectric material 70). A source region 58S is located on one side of the functional gate structure and a drain region 58D is located on another side of the functional gate structure. The source region 58S and the drain region 5D each have a topmost surface that is located above a topmost surface of the semiconductor material portion 50 and a topmost surface of the horizontal gate dielectric portion. The U-shaped gate dielectric structure of the present application provides reduced capacitance to the structure as compared to an equivalent semiconductor structure in which a U-shaped gate dielectric having a uniform thickness in the lateral and vertical directions is employed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming a gate material stack on a semiconductor material portion, said gate material stack comprising, from bottom to top, a horizontal gate dielectric portion and a gate conductor portion, wherein said horizontal gate dielectric portion has a vertical thickness;
    forming a vertical gate dielectric wall portion surrounding sidewalls of said gate material stack and extending upwards from said horizontal gate dielectric portion, said vertical gate dielectric wall portion having a lateral thickness that is greater than said vertical thickness of said horizontal gate dielectric portion;
    forming a source-side semiconductor material on one side of said gate material stack and a drain-side semiconductor material on another side of said gate material side, wherein a sidewall edge of each of said source-side semiconductor material and said drain-side semiconductor material contacts an outer sidewall of said vertical gate dielectric wall portion;
    forming a dielectric spacer on said source-side semiconductor material and said drain-side semiconductor material, said dielectric spacer contacting an outer sidewall of said vertical gate dielectric wall portion;
    forming a source region on said source-side semiconductor material and forming a drain region on said drain-side semiconductor material, wherein said forming of said source region and said forming of said drain region occur after said forming of said dielectric spacer; and
    performing an anneal which diffuses a dopant from said source region into said source-side semiconductor material and a portion of said semiconductor material portion, and diffuses a dopant from said drain region into said drain-side semiconductor material and another portion of said semiconductor material portion.

2. The method of claim 1, wherein said vertical gate dielectric wall portion has a topmost surface that is coplanar with a topmost surface of said gate conductor portion.

3. The method of claim 1, wherein said vertical gate dielectric wall portion is in direct contact with sidewall surfaces of said horizontal gate dielectric portion and said gate conductor portion.

4. The method of claim 1, wherein said vertical gate dielectric wall portion has a bottommost surface that forms an interface with a surface of said semiconductor material portion, and a lower sidewall portion that directly contacts vertical sidewall surfaces of said horizontal gate dielectric portion.

5. The method of claim 1, wherein said vertical gate dielectric wall portion comprises a different dielectric material than said horizontal gate dielectric portion.

6. The method of claim 1, wherein said vertical gate dielectric wall portion comprises a same dielectric material as said horizontal gate dielectric portion.

7. The method of claim 1, wherein said forming of said vertical gate dielectric wall portion comprises:
    depositing a gate dielectric material; and
    anisotropically etching the gate dielectric material.

8. The method of claim 1, wherein said forming of said source-side semiconductor material and said drain-side semiconductor material comprises an epitaxially growth process.

9. The method of claim 1, wherein said forming said dielectric spacer comprises:
    depositing a dielectric spacer material; and
    etching said dielectric spacer material.

10. The method of claim 1, wherein said horizontal gate dielectric portion and said vertical gate dielectric wall portion form a continuous U-shaped gate dielectric structure.

11. The method of claim 1, wherein said U-shaped gate dielectric structure provides a reduced capacitance to said structure.

12. The method of claim 1, wherein said semiconductor material portion is a semiconductor fin.

13. The method of claim 1, wherein said source-side semiconductor material forms an interface with said semiconductor material portion and has a topmost surface that is beneath a topmost surface of said gate conductor portion, and said drain-side semiconductor material forms another interface with said semiconductor material portion and has a topmost surface that is beneath said topmost surface of the gate conductor portion.

14. The method of claim 1, wherein said forming of said source region and said drain region comprises an epitaxial growth process.

15. The method of claim 1, wherein said source region comprises a same semiconductor material as said source-side semiconductor material, and said drain region comprises a same semiconductor material as said drain-side semiconductor material.

16. The method of claim 1, wherein said source region comprises a different semiconductor material than said source-side semiconductor material, and said drain region comprises a different semiconductor material than said drain-side semiconductor material.

* * * * *